United States Patent [19]

Isshiki et al.

[11] Patent Number: 4,686,483

[45] Date of Patent: Aug. 11, 1987

[54] DIGITAL FILTER CIRCUIT

[75] Inventors: Isao Isshiki; Shinichiro Takahashi, both of Osaka, Japan

[73] Assignee: Sumitomo Electric Industries, Ltd., Osaka, Japan

[21] Appl. No.: 824,891

[22] Filed: Jan. 30, 1986

[30] Foreign Application Priority Data

Jan. 30, 1985 [JP] Japan ............................ 60-10564[U]

[51] Int. Cl.[4] ...................... H03K 17/16; H03K 21/40

[52] U.S. Cl. ...................................... 328/165; 377/39; 377/30

[58] Field of Search ............................ 377/39, 44, 30; 328/165

[56] References Cited

U.S. PATENT DOCUMENTS

| | | | |
|---|---|---|---|
| 3,044,065 | 7/1962 | Barney et al. | 377/44 |
| 3,851,257 | 11/1974 | Boersma | 377/44 |
| 4,109,210 | 8/1978 | Gerlach et al. | 377/44 |
| 4,468,796 | 8/1984 | Suga | 377/39 |

*Primary Examiner*—John S. Heyman

*Attorney, Agent, or Firm*—Cushman, Darby & Cushman

[57] ABSTRACT

A digital filter circuit includes first and second counters which set and reset a latch circuit at predetermined counts. Clock pulses and the input signal are passed through a gate circuit to the first counter which outputs a set signal to the latch circuit only if the input signal is maintained at a high level for the predetermined count. Clock pulses and the inverted input signal are passed through a gate circuit to the second counter which outputs a reset signal to the latch circuit only if the input signal is maintained at a low level for the predetermined count. In this manner noise pulses on the input signal are filtered out of the output signal obtained from the latch circuit.

6 Claims, 3 Drawing Figures

INPUT SIGNAL
AND 1
CTR 1
Cp
OUT
R
LATCH
S
Q
R
OUTPUT
CLOCK PULSE
AND 2
CTR 2
Cp
OUT
R
INVERTED INPUT SIGNAL

OUTPUT
LATCH
S
Q
R
CTR 1
Cp
OUT
R
CTR 2
Cp
OUT
R
AND1
AND2
INVERTED INPUT SIGNAL
INPUT SIGNAL
CLOCK PULSE

INPUT SIGNAL
CP
ICL
INV
NAND 1
NAND 2
NAND 3
NAND 4
NAND 5
NAND 6
NOR
TFF1
TFF2
TFF3
TFF4
RS LATCH
FILTER OUTPUT 1 (INPUT SIGNAL)
2 (Cp)
3 (ICL)
4 (FILTER OUTPUT)
a
b
c
d
e
f
g
h
i
j

DIGITAL FILTER CIRCUIT

FIELD OF THE INVENTION

The invention relates to a digital filter circuit which is especially effective for use in eliminating noise resulting from multiple noise generating sources. Accordingly, the invention is particularly useful for vehicle electronic devices.

BACKGROUND OF THE INVENTION

In a digital circuit, the removal of noise components from the input signal is essential for the correct operation of the circuit. Therefore, heretofore, a filter has been inserted in the input circuit of the digital circuit, to eliminate noise components, however, it is not always possible to completely remove all the noise components.

For example, in the case where an RC low-pass analog filter is inserted in the input circuit, high-frequency noise components in the input signal may be eliminated. However, it is impossible for the filter to remove low-frequency noise components or noise components long in duration.

SUMMARY OF THE INVENTION

In view of the foregoing, an object of the invention is to provide a digital filter circuit which is especially effective in eliminating noise components particularly for devices located at places where a number of noise generating sources are present, such as vehicle electronic devices.

A digital filter cirucit according to the invention which has solved the above-described problem, is shown in FIG. 1. A first AND circuit AND1 receives an input signal and a clock pulse. A first counter CTR1 receives the output of AND1 as its clock input, and the input signal through an inverter. A latch circuit LATCH is set by a predetermined output of CTR1 and a second AND circuit AND2 receives the input signal, through the inverter, and the clock pulse. A second counter CTR2 receives the output of AND2 as its clock input and the input signal as its reset input. In operation the LATCH is reset by a predetermined output of CTR2.

In this way noise pulses in the input signal are removed. More specifically, the input signal must be at a high level for a predetermined number of clock pulses before CTR1 sets the latch and the input signal must be at a low level for a predetermined number of clock pulses before CTR2 resets the latch. Whenever the input signal goes low CTR1 is reset through the inverter and whenever the input signal goes high CTR2 is reset directly by the input signal.

DETAILED DESCRIPTION OF THE INVENTION

Figure 1:
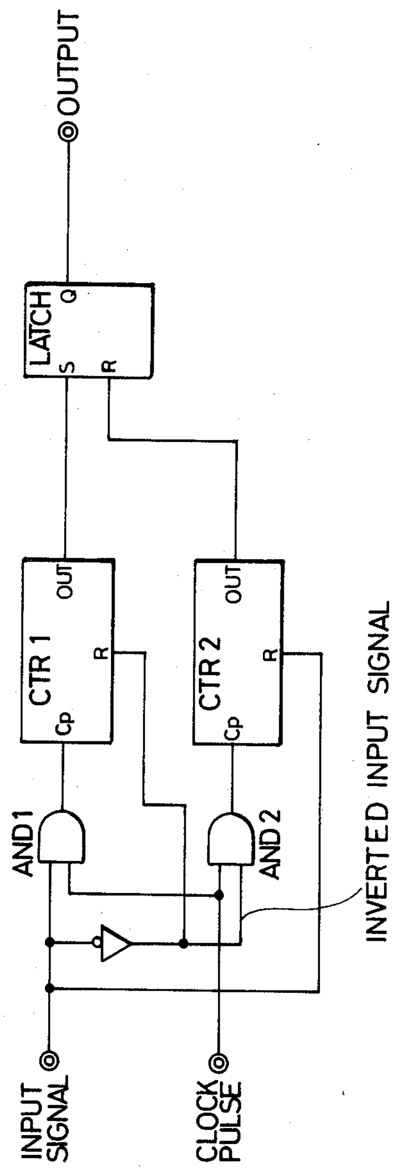
FIG. 1 is a circuit block diagram, showing an embodiment of the digital filter circuit according to the invention.
Figure 2:
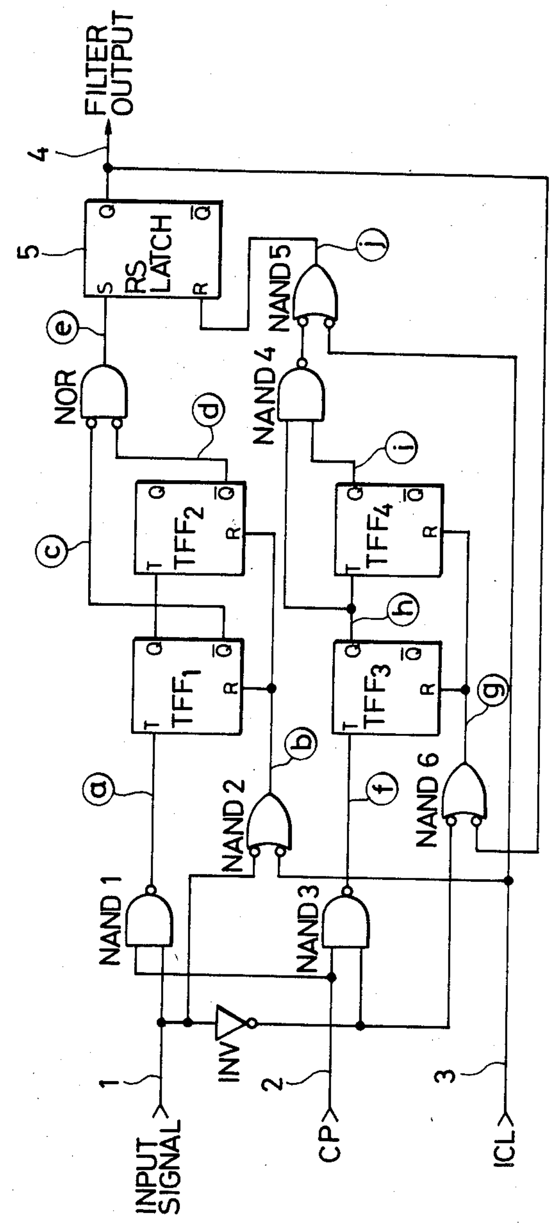
FIG. 2 is a circuit block diagram, showing a modified embodiment of the digital filter circuit according to the invention.
Figure 3:
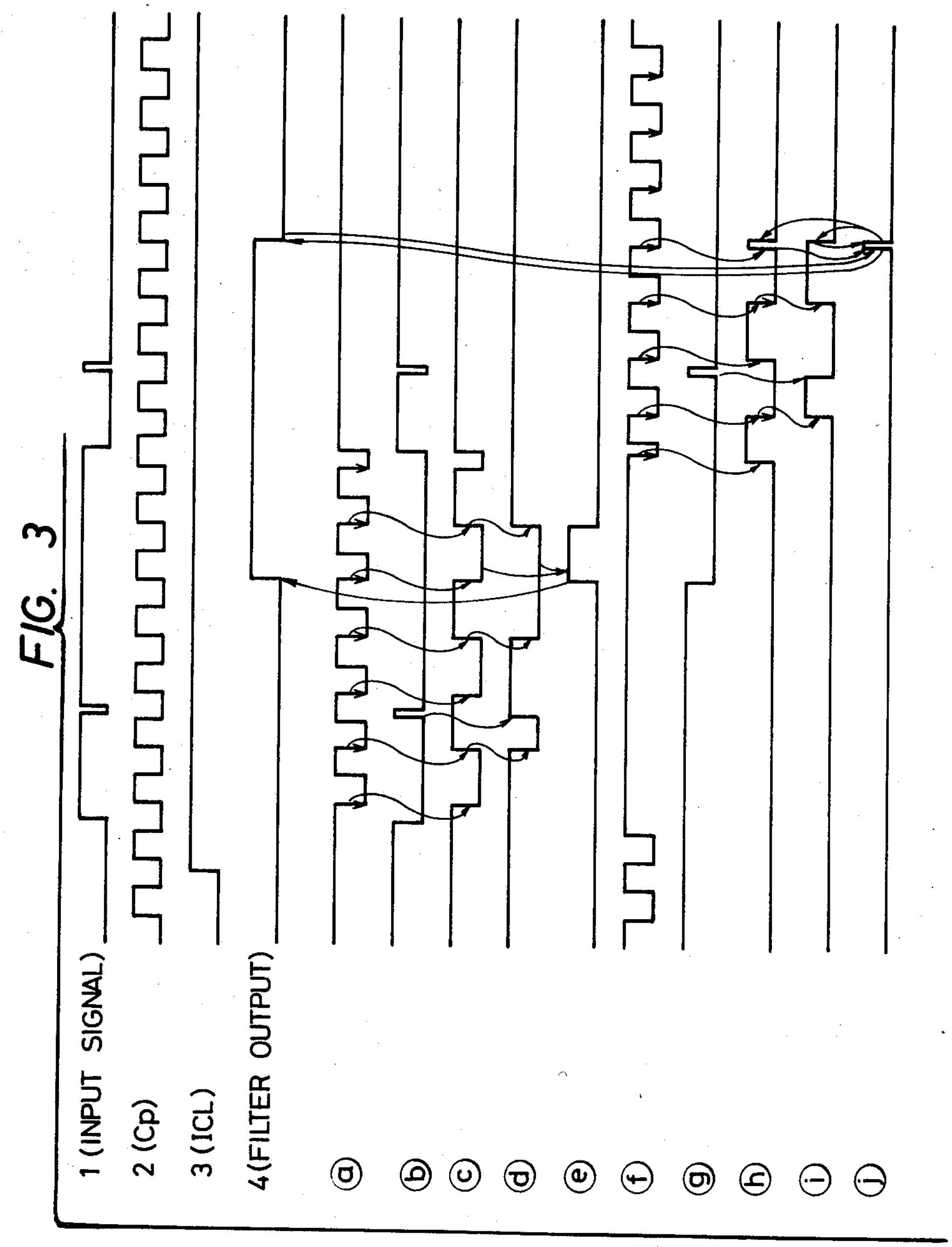
FIG. 3 is a timing chart of the various signals present in the FIG. 2 embodiment of the invention.

A modified embodiment of the digital filter circuit according to the invention will now be described in greater detail with reference to FIGS. 2 and 3. Digital input signal 1 is applied to one input terminal of first NAND circuit NAND1, and the other input terminal of NAND1 receives clock pulse (CP) 2. The input signal is a pulse or level signal having two levels, i.e., a high level and a low level (hereinafter referred to merely as "H" or "H level", and "L" or "L level", respectively, when applicable) as shown in FIG. 3. The period of clock pulse 2 is much shorter than that of input signal 1. When input signal 1 is raised to "H", clock pulse 2 is applied through NAND circuit NAND1 to the T terminal of flip-flop $TFF_1$ as shown by line a of FIG. 3, and the output at the Q terminal of flip-flop $TFF_1$ is inverted whenever the clock pulse 2 falls. The output provided at the $\overline{Q}$ terminal of flip-flop $TFF_2$ is inverted whenever the Q terminal output of flip-flop $TFF_1$ falls. Therefore, every three clock pulses 2, the $\overline{Q}$ terminal output of flip-flop $TFF_1$ and the Q terminal output of flip-flop $TFF_2$ are set to "L" simultaneously, and a NOR circuit receiving the $\overline{Q}$ terminal outputs of flip-flops $TFF_1$ and $TFF_2$ (see lines c and d of FIG. 3), provides an "H" output to set RS latch 5 (see line e of FIG. 3), as a result of which the Q terminal output of RS latch 5 is raised to "H" similarly as in the case of the input signal.

On the other hand, input signal 1 and an initial clear signal (iCL) 3 are applied to second NAND circuit NAND2, the output of which is applied to the R (reset) terminals of flip-flops $TFF_1$ and $TFF_2$ (see line b of FIG. 3). Therefore, when iCL is high and if input signal 1 is raised to "H" from "L", and, if during the operation of flip-flops $TFF_1$ and $TFF_2$ the input signal is set to "L" in response to a noise component, then flipflops $TFF_1$ and $TFF_2$ are reset, and RS latch 5 is not set. Accordingly the "H" level of the input signal is set into and outputted by RS latch 5 with a delay time corresponding to three clock pulses from the time instant when previous noise occurred.

When input signal 1 is set to "L" from "H", the clock pulse passes through third NAND circuit NAND3 which receives input signal 1, through an inverter, and clock pulse 2, and flip-flops $TFF_3$ and $TFF_4$, which respond to the "L" level of the input pulse, operate similarly as in the case of the aforementioned flip-flops $TFF_1$ and $TFF_2$ (see line f of FIG. 3). Accordingly, with the third clock pulse from the time instant when the input signal 1 is set to "L", the Q terminal outputs of flip-flops $TFF_3$ and $TFF_4$ are raised to "H" (see lines h and i of FIG. 3), so that the output of fourth NAND circuit NAND4 is set to "L". The output of NAND circuit NAND4 is applied to fifth NAND circuit NAND5, where it is inverted. The output of NAND circuit NAND5 is applied to the R terminal of RS latch 5, so that the Q terminal output of RS latch 5 is set to "L" again (see line j of FIG. 3). Accordingly, RS latch 5 provides the output pulse at the Q terminal with a delay time corresponding to at least three clock pulses from the level change of input signal 1. Thus, the digital filter circuit according to the invention can provide a filter output 4 from which the noise component mixed in the input pulse has been completely removed. The delay time of the input pulse can be represented by the following expresseion:

$2.5\ Tcp \pm \frac{1}{2}\ Tcp$ where Tcp is the period of the clock pulse.

If noise occurs within a period of time corresponding to three clock pulses from the level change of the input signal as was described above, a noise delay ts is added thereto. However, its effect on the digital circuit system can be disregarded by selecting the frequency of the clock pulse to a suitable value.

A sixth NAND circuit NAND6 receives the input signal through the inverter, and the Q terminal output of the RS latch circuit. Therefore, if the noise causes the input signal to go to the "H" level while three clock pulses are counted from the time instant the input signal is set to "L", flip-flops $TFF_3$ and $TFF_4$ are reset and the clock pulse is counted again similarly as in the case of flip-flops $TFF_1$ and $TFF_2$ (see line g of FIG. 3). The period Tcp, and the number of stages of T flip-flops should be determined in accordance with the noise width, etc.

With the digial filter circuit according to the invention, even at places where a number of noise sources are present such as, for example, where vehicle electronic devices are provided, the noise components mixed in the input signal can be completely eliminated therefrom; that is, data processing can be achieved with considerably high reliability.

Although the invention has been described with respect to specific embodiments, it should be clear that there are numerous variations within the scope of the invention. Thus, the invention is intended to cover not only the described embodiments, but also those variations falling within the scope of the appended claims.

What is claimed is:

1. A digital filter circuit, for filtering noise from a bilevel input signal, said circuit comprising:

clock means for generating a clock signal;

first gate means for receiving said input signal and said clock signal and for outputting said clock signal when said input signal is at a high level;

first counter means for receiving the output of said first gate means as a clock input, for providing a first output signal at a predetermined count of said clock input, but said first counter means being reset anytime from noise by said going to a low level;

latching means being set in response to said first output signal of said first counter means;

inverting means for receiving said input signal and generating an inverted input signal;

second gate means for receiving said inverted input signal and said clock signal and for outputting said clock signal when said input signal is at a low level;

second counter means for receiving the output of said second gate means as a clock input, and for providing a second output signal at a predetermined count of said clock input but, said second counter means being reset anytime from noise by said input signal going to a high level;

said latching means being reset in response to said second output signal of said second counter means, whereby said latching means provides a filtered signal from the predetermined counts of said first and second counters.

2. A circuit as claimed in claim 1 wherein said first and second gate means comprise first and second AND gates, respectively.

3. A circuit as claimed in claim 1 wherein said inverting means further provides said inverted input signal to said first counting means for resetting said first counting means whenever said input signal goes to a low level.

4. A circuit as claimed in claim 1 wherein said first and second gate means comprise first and second NAND gates, respectively.

5. A circuit as claimed in claim 1 wherein said first counting means comprises first and second flip-flops and a NOR gate; said first flip-flop receiving said output clock signal from said first gate means, having a first output connected to the input of said second flip-flop, having a second inverted output connected to a first input of said NOR gate and being reset by said input signal going to a low level; said second flip-flop having an inverted output connected to a second input of said NOR gate and being reset by said input signal going to a low level; the output of said NOR gate providing a latching signal to said latching means.

6. A circuit as claimed in claim 5 wherein said second counting means comprises third and fourth flip-flops and a third gate means; said third flip-flop receiving said output clock signal from said second gate means, having an output connected to the input of said fourth flip-flop and a first input of said third gate means and being reset by said input signal going to a high level; said fourth flip-flop having an output connected to a second input of said third gate means and being reset by said input signal going to a high level.

* * * * *